(12) United States Patent
Xu et al.

(10) Patent No.: US 8,354,945 B2
(45) Date of Patent: Jan. 15, 2013

(54) MOTHERBOARD HAVING A KEY COMBINATION INPUT FUNCTION BY PRESSING A SINGLE KEY

(75) Inventors: Dan Xu, Shenzhen (CN); Song-Lin Tong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 356 days.

(21) Appl. No.: 12/818,183

(22) Filed: Jun. 18, 2010

(65) Prior Publication Data
US 2011/0285551 A1   Nov. 24, 2011

(30) Foreign Application Priority Data
May 21, 2010   (CN) .......................... 2010 1 0179544

(51) Int. Cl.
*H03K 17/94*   (2006.01)

(52) U.S. Cl. ............................................. 341/22; 341/23
(58) Field of Classification Search .................... 341/23, 341/22
See application file for complete search history.

(56) References Cited

U.S. PATENT DOCUMENTS
6,437,709 B1 *   8/2002   Hao ................................ 341/23

* cited by examiner

*Primary Examiner* — Jean B Jeanglaude
(74) *Attorney, Agent, or Firm* — Altis Law Group, Inc.

(57) ABSTRACT

A keyboard includes a number of first keys, a control circuit, a switch circuit, and a second key. The switch circuit includes a number of switches. The second key is connected to first terminals of two switches of the switch circuit via the control circuit. A second terminal of each of the switches is connected to a first key. When a second key is pressed, the control circuit controls the switches corresponding to the pressed second key to be turned on, to activate the first keys which are connected to the switches.

13 Claims, 3 Drawing Sheets

MOTHERBOARD HAVING A KEY COMBINATION INPUT FUNCTION BY PRESSING A SINGLE KEY

BACKGROUND

1. Technical Field

The present disclosure relates to keyboards, and particularly to a computer keyboard.

2. Description of Related Art

Instead of clicking on a series of items on a drill down menu, a user can use a shortcut, by simultaneously pressing down on a combination of keys on a keyboard, to execute a command/function of an application. For example, a user can press "Ctrl" key+"C" key to copy a selected item to a clipboard, and press "Ctrl" key+"V" key to paste the clipboard content to a current location. But using the shortcut requires the user to press two or more keys at the same time which can be an inconvenience. Therefore, there are room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings is illustrated by way of example and not by limitation. It should be noted that references to "an" or "one" embodiment in this disclosure are not necessarily to the same embodiment, and such references mean at least one.

Figure 1:
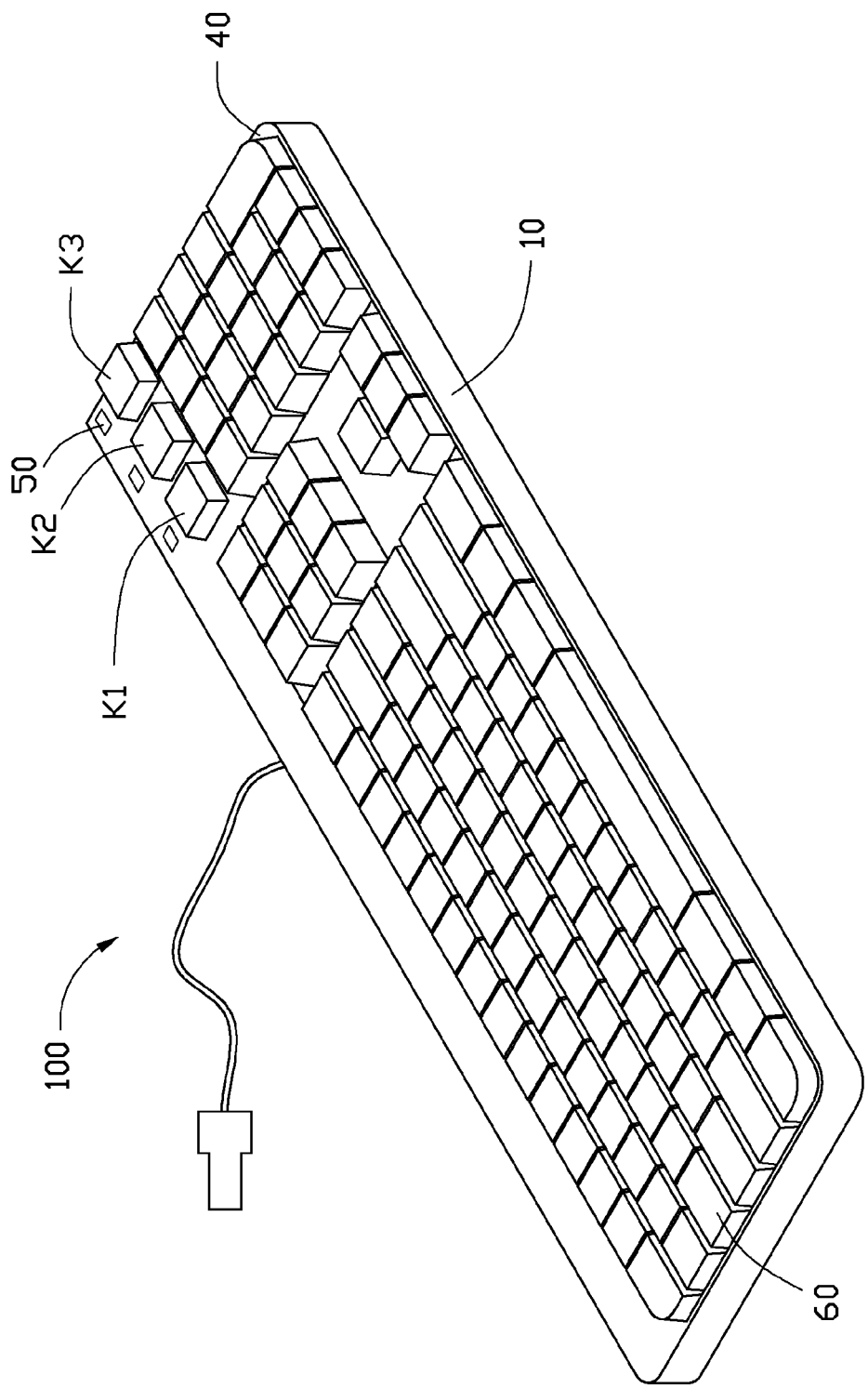
FIG. 1 is a schematic view of an exemplary embodiment of a keyboard.
Figure 2:
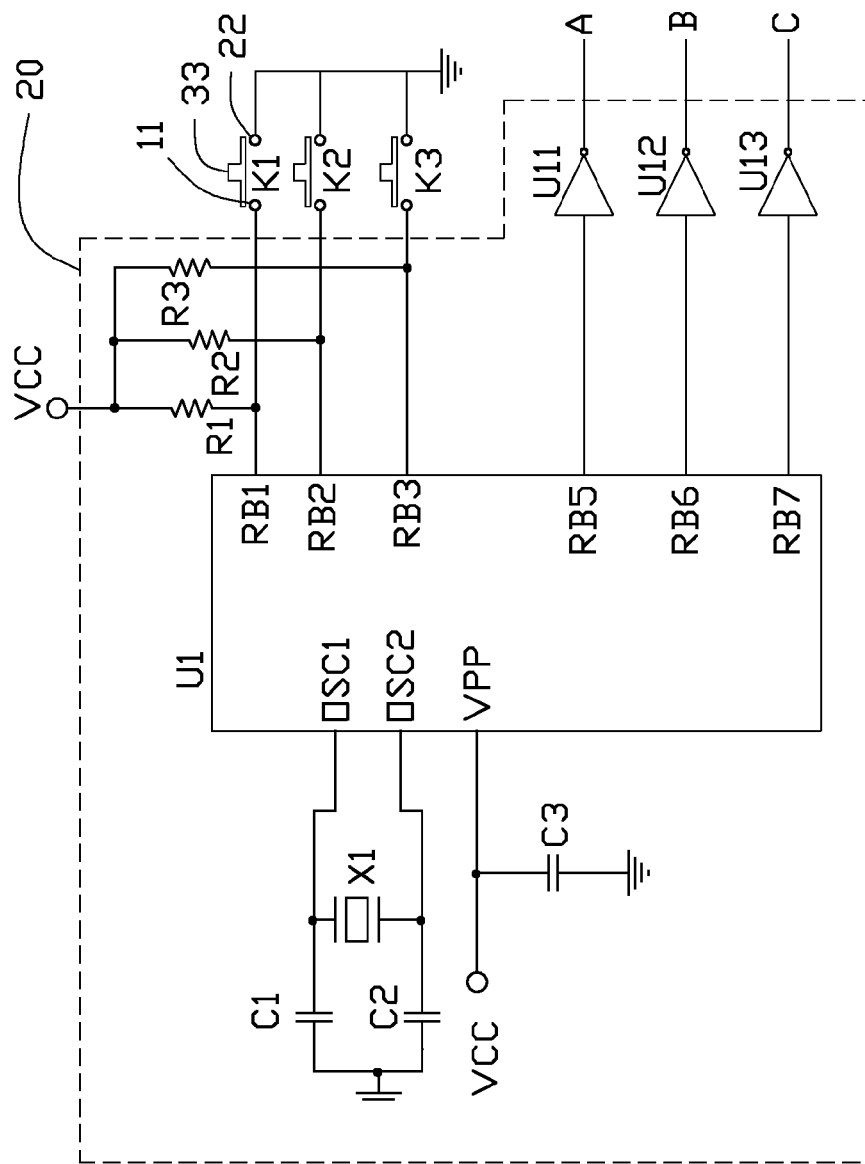
FIGS. 2 and 3 are circuit diagrams of the keyboard of FIG. 1.
Figure 3:
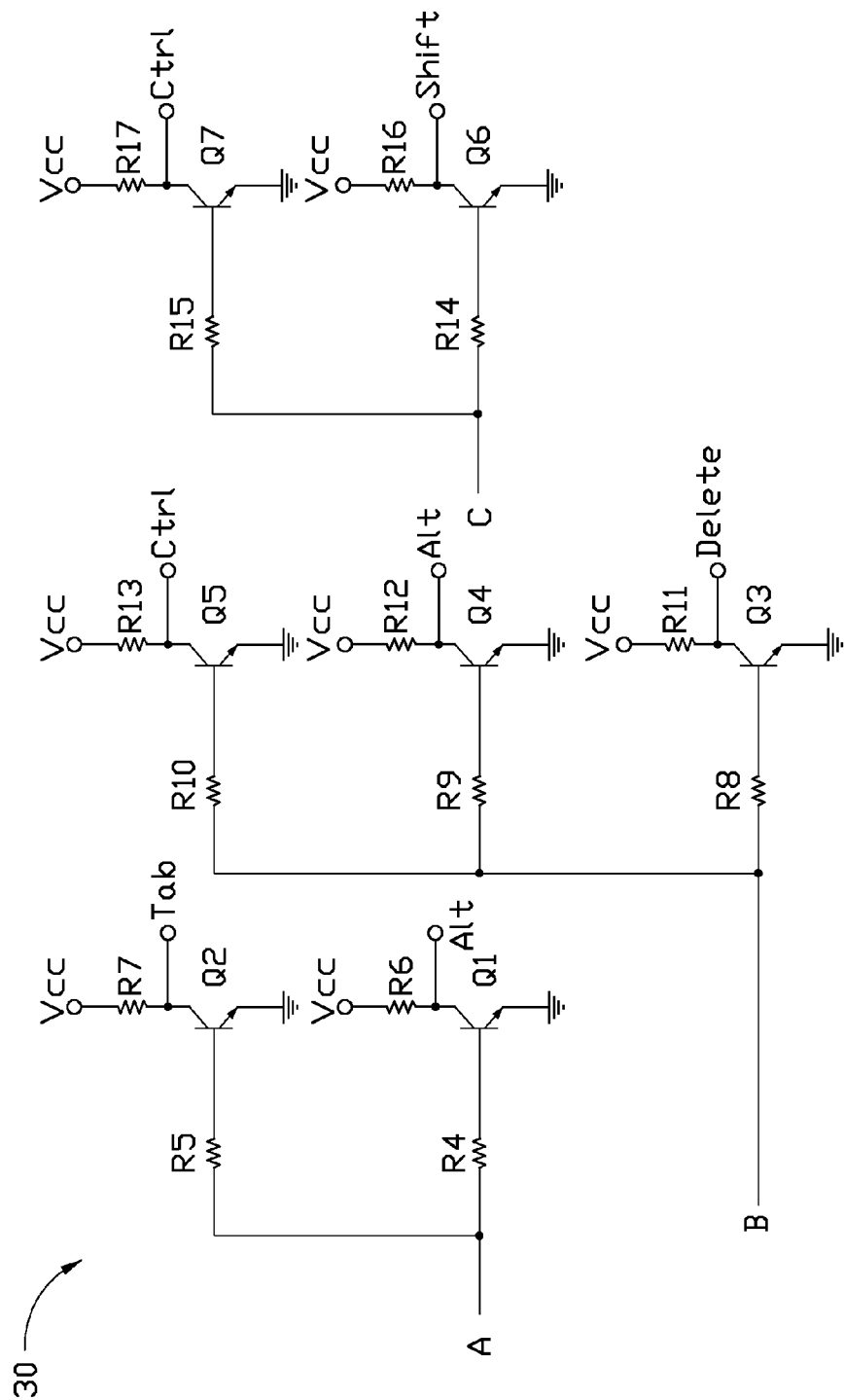

Referring to FIGS. 1 to 3, an exemplary embodiment of a keyboard 100 includes a housing 10, a plurality of first keys 60 arranged on the housing 10, three second keys K1, K2, and K3 arranged on the housing 10, and a control circuit 20 and a switch circuit 30 arranged in the housing 10. Each of the second keys K1-K3 are multi-input keys that can be used instead of having to use a key combination, and are arranged between a number key area 40 and an indicator area 50 of the keyboard 100. Arrangement and configuration of the first keys 60 of the keyboard 100 are the same as or similar to arrangement and configuration of keys on an ordinary keyboard.

Each key of the second keys K1-K3 includes two electronic terminals 11 and 22, and a key cap 33. The second keys K1-K3 and the switch circuit 30 are connected to the control circuit 20. When one of the second keys K1-K3 is pressed, an input pin of the control circuit 20 connected to the pressed second key receives a low level signal (e.g., 0 volts). As a result of this input low level signal, the control circuit 20 outputs a high level signal (e.g., 3 volts) to the switch circuit 30 to control switches of the switch circuit 30, corresponding to the pressed second key, to be turned on and to output low level signals (e.g., 0 volts) resulting in multiple input that is the same as a key combination corresponding to the pressed second key. Therefore, a single second key can be pressed to duplicate the input of a key combination. In one embodiment, the second keys K1-K3 may be push-type switches or other kind of switches.

The control circuit 20 includes a microcontroller U1, a crystal oscillator X1, capacitors C1-C3, inverters U11-U13, and resistors R1-R3. A clock pin OSC1 of the microcontroller U1 is grounded via the capacitor C1. A clock pin OSC2 of the microcontroller U1 is grounded via the capacitor C2. The crystal oscillator X1 is connected between the clock pins OSC1 and OSC2 of the microcontroller U1. A voltage pin VPP of the microcontroller U1 is connected to a power source VCC and also grounded via the capacitor C3. An input pin RB1 of the microcontroller U1 is connected to the electronic terminal 11 of the second key K1. An input pin RB2 of the microcontroller U1 is connected to the electronic terminal 11 of the second key K2. An input pin RB3 of the microcontroller U1 is connected to the electronic terminal 11 of the second key K3. The electronic terminals 22 of the second keys K1-K3 are grounded. The resistor R1 is connected between the input pin RB1 of the microcontroller U1 and the power source VCC. The resistor R2 is connected between the input pin RB2 of the microcontroller U1 and the power source VCC. The resistor R3 is connected between the input pin RB3 of the microcontroller U1 and the power source VCC. An output pin RB5 of the microcontroller U1 is connected to an input terminal of the inverter U11. An output pin RB6 of the microcontroller U1 is connected to an input terminal of the inverter U12. An output pin RB7 of the microcontroller U1 is connected to an input terminal of the inverter U13. Output terminals of the inverters U11-U13 are connected to the switch circuit 30. In one embodiment, a type of the microcontroller U1 is PIC16C54/JW(18). The inverters U11-U13 are type 74LS14.

The switch circuit 30 includes transistors Q1-Q7 and resistors R4-R17. A base of the transistor Q1 is connected to the output terminal of the inverter U11 via the resistor R4. A collector of the transistor Q1 is connected to a control terminal of a first key "Alt" of the keyboard 100 and also connected to the power source VCC via the resistor R6. A base of the transistor Q2 is connected to the output terminal of the inverter U11 via the resistor R5. A collector of the transistor Q2 is connected to a control terminal of the first key "Tab" of the keyboard 100 and also connected to the power source VCC via the resistor R7. A base of the transistor Q3 is connected to the output terminal of the inverter U12 via the resistor R8. A collector of the transistor Q3 is connected to a control terminal of the first key "Delete" of the keyboard 100 and also connected to the power source VCC via the resistor R11. A base of the transistor Q4 is connected to the output terminal of the inverter U12 via the resistor R9. A collector of the transistor Q4 is connected to the control terminal of the first key "Alt" of the keyboard 100 and also connected to the power source VCC via the resistor R12. A base of the transistor Q5 is connected to the output terminal of the inverter U12 via the resistor R10. A collector of the transistor Q5 is connected to a control terminal of the first key "Ctrl" of the keyboard 100 and also connected to the power source VCC via the resistor R13. A base of the transistor Q6 is connected to the output terminal of the inverter U13 via the resistor R14. A collector of the transistor Q6 is connected to a control terminal of the first key "Shift" of the keyboard 100 and also connected to the power source VCC via the resistor R16. A base of the transistor Q7 is connected to the output terminal of the inverter U13 via the resistor R15. A collector of the transistor Q7 is connected to the control terminal of the first key "Ctrl" of the keyboard 100 and also connected to the power source VCC via the resistor R17. Emitters of the transistor Q1-Q7 are grounded. In one embodiment, the transistors Q1-Q7 functioning as electronic switches are npn transistors. In other embodiments, the transistors Q1-Q7 can be other types of electronic switches, such as n-channel metal oxide semiconductor field effect transistors (NMOSFETs). In other embodiments, the number of the second keys K1-K3 and the transistors Q1-Q7 can be designed according to need. The collectors of the transistors Q1-Q7 can be connected to different key combination to execute different operation functions.

In use, in this embodiment, the key cap 33 of the second key K1 is pressed to input the same signals as would be input by simultaneously pressing the first keys "Alt"+"Tab". The electronic terminals 11 and 22 of the second key K1 are connected together. The input pin RB1 of the microcontroller U1 receives a low level signal. The output pin RB5 of the microcontroller U1 outputs a low level signal (e.g., 0 volts) to the input terminal of the inverter U11. The output terminal of the inverter U11 outputs a high level signal (e.g., 3 volts) to the bases of the transistors Q1 and Q2. The transistors Q1 and Q2 are turned on. The collector of the transistor Q1 outputs a low level signal (e.g., 0 volts) to close the circuit of the first key "Alt" of the keyboard 100. The collector of the transistor Q2 outputs a low level signal (e.g., 0 volts) to close the circuit of the first key "Tab" of the keyboard 100. Because the collectors of the transistors Q1 and Q2 output low level signals simultaneously, the first keys "Alt" and "Tab" are both activated without directly pressing them. Namely, when the second key K1 is pressed, the function of key combination of the first keys "Alt"+"Tab" can be executed. When the second key K2 is pressed, function of key combination of the first keys "Ctrl"+"Alt"+"Delete" can be executed. When the second key K3 is pressed, function of the key combination of the first keys "Ctrl"+"Shift" can be executed. The second keys K2 and K3 function in the same manner as the second key K1.

For convenient left-handed operation, a second "Del" key is arranged between "Esc" key and "F1" key of the keyboard 100. When the second "Del" key is pressed, the Delete function is executed. A location of the second "Del" key can be arranged at other locations of the keyboard 100 according to need.

Single keys of the keyboard 100 can be operated to execute the function of key combination, which is very convenient.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A keyboard comprising:
a plurality of first keys;
a control circuit;
a switch circuit comprising a plurality of electronic switches; and
at least one second key, wherein each second key is connected to first terminals of at least two electronic switches of the switch circuit via the control circuit, a second terminal of each electronic switch of the switch circuit is connected to a corresponding first key;
wherein when the at least one second key is pressed, the control circuit controls the electronic switches corresponding to the pressed second key to be turned on, to start the first keys which are connected to the electronic switches for executing a function of key combination of the first keys.

2. The keyboard of claim 1, wherein the keyboard comprises a housing, the second keys are arranged on the housing and arranged between a number key area of the keyboard and an indicator area of the keyboard, the control circuit and the switch circuit are arranged in the housing.

3. The keyboard of claim 1, wherein the second keys are push-type switches.

4. The keyboard of claim 1, wherein the control circuit comprises a microcontroller, a crystal oscillator, first to third inverters, and first to third resistors, the at least one second key comprises three second keys, the crystal oscillator is connected between a first clock pin and a second clock pin of the microcontroller, a voltage pin of the microcontroller is connected to a power source, a first input pin of the microcontroller is connected to a first electronic terminal of a first one of the second keys, a second input pin of the microcontroller is connected to a first electronic terminal of a second one of the second keys, a third input pin of the microcontroller is connected to a first electronic terminal of a third one of the second keys, second electronic terminals of the first to third second keys are grounded, the first resistor is connected between the first input pin of the microcontroller and the power source, the second resistor is connected between the second input pin of the microcontroller and the power source, the third resistor is connected between the third input pin of the microcontroller and the power source, a first output pin of the microcontroller is connected to an input terminal of the first inverter, a second output pin of the microcontroller is connected to an input terminal of the second inverter, a third output pin of the microcontroller is connected to an input terminal of the third inverter, output terminals of the first to third inverters are connected to the switch circuit.

5. The keyboard of claim 4, wherein the control circuit further comprises first to third capacitors, the first capacitor is connected between the first clock pin of the microcontroller and ground, the second capacitor is connected between the second clock pin of the microcontroller and ground, the third capacitor is connected between the voltage pin of the microcontroller and ground.

6. The keyboard of claim 4, wherein the switch circuit comprises first to seventh electronic switches and fourth to tenth resistors, first terminals of the first and the second electronic switches are connected to the output terminal of the first inverter, a second terminal of the first electronic switch is connected to a control terminal of the first key "Alt" of the keyboard and also connected to the power source via the fourth resistor, a second terminal of the second electronic switch is connected to a control terminal of the first key "Tab" of the keyboard and also connected to the power source via the fifth resistor, first terminals of the third to the fifth electronic switches are connected to the output terminal of the second inverter, a second terminal of the third electronic switch is connected to a control terminal of the first key "Delete" of the keyboard and also connected to the power source via the sixth resistor, a second terminal of the fourth electronic switch is connected to the control terminal of the first key "Alt" and also connected to the power source via the seventh resistor, a second terminal of the fifth electronic switch is connected to a control terminal of the first key "Ctrl" and also connected to the power source via the eighth resistor, first terminals of the sixth and the seventh electronic switches are connected to the output terminal of the third inverter, a second terminal of the sixth electronic switch is connected to a control terminal of the first key "Shift" and also connected to the power source via the ninth resistor, a second terminal of the seventh electronic switch is connected to the control terminal of the first key "Ctrl" of the keyboard and also connected to the power source via the tenth resistor, third terminals of the first to the seventh switches are all grounded, when the first one of the second keys is pressed, the first and the second electronic switches are turned on, to execute function of key combination "Alt" key+"Tab" key, when the second one of the second keys is pressed, the third to fifth switches are turned on, to execute function of key combination "Ctrl" key+"Alt" key+"Delete" key, the third one of the second keys is pressed, the sixth and the seventh switches are turned on, to execute function of key combination "Ctrl" key+"Shift" key.

7. The keyboard of claim 6, wherein the switch circuit further comprises eleventh to seventeenth resistors, the eleventh and twelfth resistors is respectively connected between the first terminals of the first and the second electronic switches and the output terminal of the first inverter, the thirteenth to fifteenth resistors are respectively connected between the first terminals of the third to the fifth electronic switches and the output terminal of the second inverter, the sixteenth and seventeenth resistors are respectively connected between the first terminals of the sixth and the seventh electronic switches and the output terminal of the third inverter.

8. The keyboard of claim 7, wherein the first to seventh electronic switches are npn transistors, and the first to third terminals of the first to seventh switches are bases, collectors, and emitters of the transistors, respectively.

9. A keyboard comprising:
a plurality of first keys;
a switch circuit comprising a plurality of electronic switches;
at least one second key, wherein the at least one second key comprises three second keys; and
a control circuit comprising a microcontroller, a crystal oscillator, first to third inverters, and first to third resistors, wherein the crystal oscillator is connected between a first clock pin and a second clock pin of the microcontroller, a voltage pin of the microcontroller is connected to a power source, a first input pin of the microcontroller is connected to a first electronic terminal of a first one of the second keys, a second input pin of the microcontroller is connected to a first electronic terminal of a second one of the second keys, a third input pin of the microcontroller is connected to a first electronic terminal of a third one of the second keys, second electronic terminals of the first to third second keys are grounded, the first resistor is connected between the first input pin of the microcontroller and the power source, the second resistor is connected between the second input pin of the microcontroller and the power source, the third resistor is connected between the third input pin of the microcontroller and the power source, a first output pin of the microcontroller is connected to an input terminal of the first inverter, a second output pin of the microcontroller is connected to an input terminal of the second inverter, a third output pin of the microcontroller is connected to an input terminal of the third inverter, each of output terminals of the first to third inverters are connected to first terminals of at least two electronic switches of the switch circuit, a second terminal of each electronic switch of the switch circuit is connected to a corresponding first key;
wherein when the at least one second key is pressed, the control circuit controls the electronic switches corresponding to the pressed second key to be turned on, to start the first keys which are connected to the electronic switches for executing a function of key combination of the first keys.

10. The keyboard of claim 9, wherein the control circuit further comprises first to third capacitors, the first capacitor is connected between the first clock pin of the microcontroller and ground, the second capacitor is connected between the second clock pin of the microcontroller and ground, the third capacitor is connected between the voltage pin of the microcontroller and ground.

11. The keyboard of claim 9, wherein the switch circuit comprises first to seventh electronic switches and fourth to tenth resistors, first terminals of the first and the second electronic switches are connected to the output terminal of the first inverter, a second terminal of the first electronic switch is connected to a control terminal of the first key "Alt" of the keyboard and also connected to the power source via the fourth resistor, a second terminal of the second electronic switch is connected to a control terminal of the first key "Tab" of the keyboard and also connected to the power source via the fifth resistor, first terminals of the third to the fifth electronic switches are connected to the output terminal of the second inverter, a second terminal of the third electronic switch is connected to a control terminal of the first key "Delete" of the keyboard and also connected to the power source via the sixth resistor, a second terminal of the fourth electronic switch is connected to the control terminal of the first key "Alt" and also connected to the power source via the seventh resistor, a second terminal of the fifth electronic switch is connected to a control terminal of the first key "Ctrl" and also connected to the power source via the eighth resistor, first terminals of the sixth and the seventh electronic switches are connected to the output terminal of the third inverter, a second terminal of the sixth electronic switch is connected to a control terminal of the first key "Shift" and also connected to the power source via the ninth resistor, a second terminal of the seventh electronic switch is connected to the control terminal of the first key "Ctrl" of the keyboard and also connected to the power source via the tenth resistor, third terminals of the first to the seventh switches are all grounded, when the first one of the second keys is pressed, the first and the second electronic switches are turned on, to execute function of key combination "Alt" key+"Tab" key, when the second one of the second keys is pressed, the third to fifth switches are turned on, to execute function of key combination "Ctrl" key+"Alt" key+"Delete" key, the third one of the second keys is pressed, the sixth and the seventh switches are turned on, to execute function of key combination "Ctrl" key+"Shift" key.

12. The keyboard of claim 11, wherein the switch circuit further comprises eleventh to seventeenth resistors, the eleventh and twelfth resistors is respectively connected between the first terminals of the first and the second electronic switches and the output terminal of the first inverter, the thirteenth to fifteenth resistors are respectively connected between the first terminals of the third to the fifth electronic switches and the output terminal of the second inverter, the sixteenth and seventeenth resistors are respectively connected between the first terminals of the sixth and the seventh electronic switches and the output terminal of the third inverter.

13. The keyboard of claim 12, wherein the first to seventh electronic switches are npn transistors, and the first to third terminals of the first to seventh switches are bases, collectors, and emitters of the transistors, respectively.

* * * * *